United States Patent [19]

Baldyga

[11] 4,129,939
[45] Dec. 19, 1978

[54] METHOD OF MAKING PRINTED CIRCUIT

[75] Inventor: Joseph W. Baldyga, Mt. Clemens, Mich.

[73] Assignee: Diamond Die & Mold Co., Mt. Clemens, Mich.

[21] Appl. No.: 826,514

[22] Filed: Aug. 22, 1977

[51] Int. Cl.² .............................................. H05K 3/10
[52] U.S. Cl. .................................... 29/625; 156/298; 156/196; 174/117 FF
[58] Field of Search .............................. 29/624, 625; 174/117 FF, 68.5; 156/298, 196

[56] References Cited

U.S. PATENT DOCUMENTS

| 2,971,249 | 2/1961 | Anderson et al. | 29/625 |
| 3,674,914 | 7/1972 | Burr | 29/625 X |
| 4,065,850 | 1/1978 | Burr | 29/625 |

Primary Examiner—Victor A. DiPalma
Attorney, Agent, or Firm—Whittemore, Hulbert & Belknap

[57] ABSTRACT

Structure equivalent to conventional printed circuits is made by forming round wires, usually copper, into the shapes the conductor strips are to occupy, fixing the wires to a surface of a thin plastic sheet, and then pressing the assembly between flat opposed die surfaces to form the wires into thin flat flexible strips.

14 Claims, 8 Drawing Figures

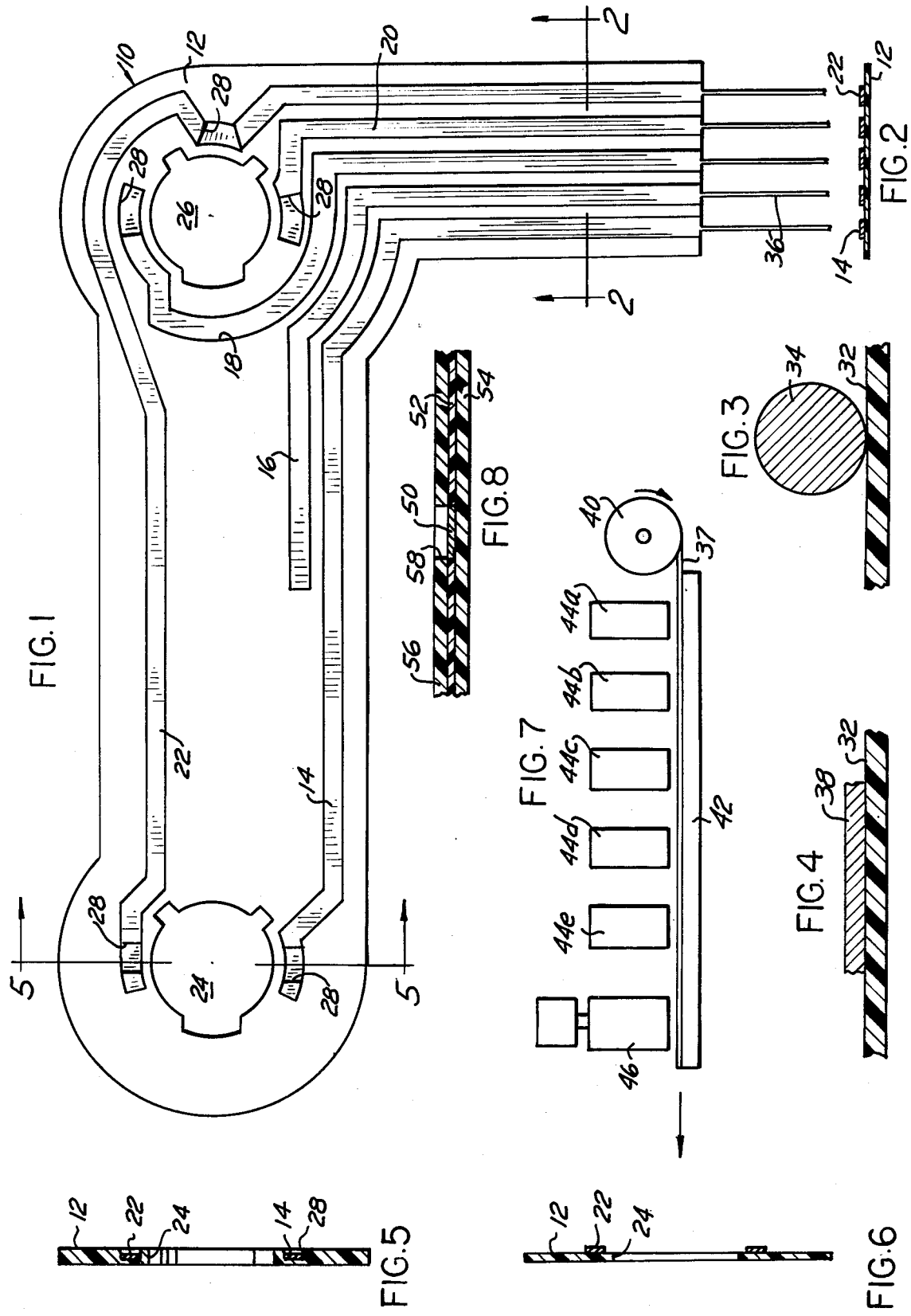

METHOD OF MAKING PRINTED CIRCUIT

SUMMARY OF THE INVENTION

In the past printed circuits have been produced in which a plurality of thin flat conductors are applied to one surface of an insulating sheet. The usual procedure is to adhere a thin sheet of copper to the insulating sheet, to treat the exposed surface of the copper sheet with a resist material blocking the action of an etching material, forming a pattern in which the treated surfaces conform to the desired pattern of conducting strips, placing the assembly in an etching bath, and finally removing the resist material to expose the conducting material in the desired pattern.

In general terms the present invention produces the equivalent of printed circuits by shaping round copper wires into the configuration desired for the conducting strips, fixing the shaped wires on a thin plastic insulating sheet in the pattern desired to be formed by the conducting strips, and pressing the assembly between opposed flat die faces to form the round wires, into thin flat strips. As a result the copper strips are exposed at one surface of the pressed assembly. The pressed assembly may be adhered to a second insulating sheet, leaving the flat strips exposed. Alternatively, the pressed assembly may be adhered between opposed flat insulating sheets, and openings provided to one of the sheets overlying the strips to provide for connection of the flat conductors into an electrical circuit.

An important advantage of the present method and product is that ends of some wires may extend beyond the zone of pressure application and preferably beyond the edge of a pressed assembly, to leave integral round connector portions by which the strips forming a part thereof may be connected into an electrical circuit by conventional connectors, thus eliminating the necessity for soldered connection.

BRIEF DESCRIPTION OF DRAWINGS

FIG. 1 is a plan view of a circuit board constructed in accordance with the present invention.

FIG. 2 is a section on the line 2—2, FIG. 1.

FIG. 3 is an enlarged fragmentary sectional view through a wire in place prior to flattening.

FIG. 4 is an enlarged sectional view of the wire of FIG. 3 flattened, and bonded to the plastic sheet.

FIG. 5 is a sectional view on the line 5—5, FIG. 1.

FIG. 6 is a view similar to FIG. 4, in which one side of the conducting strips is exposed.

FIG. 7 is a diagrammatic view illustrating the method and apparatus for making the printed circuit equivalents.

FIG. 8 is a fragmentary sectional view of a further embodiment of my invention.

COMPLETE DESCRIPTION

In FIG. 1 there is illustrated a circuit device 10 comprising a thin flat sheet 12 of insulating material, which conveniently may be a polyethylene terephthalate sold under the Registered Trademark Mylar and cut to an outline in accordance with its intended use. The actual structure illustrated is for use in a park-turn signal for automobiles.

The construction is generally similar to so-called printed circuits which may in general take two forms. In the first form, circuit elements in the form of thin flat strips of metal, usually copper, are provided on and exposed at one side of a non-conducting sheet, usually the transparent plastic. The second form is similar, except that the conducting strips are covered usually by a thin ply of transparent plastic, and access to the conducting strips within the edges of the sheet is through openings provided in the cover ply. The present invention is applicable to the production of either type.

In FIG. 1 the sheet 12 has formed thereon a plurality of conducting strips by a method which will subsequently be described. The conducting strips are designated 14, 16, 18, 20 and 22 and their shape and arrangement is dictated by the use which is to be made of the circuit. In the present case the sheet 10 is provided with openings 24 and 26 shaped to receive bulb sockets and to furnish the required electrical connection between the sockets and appropriate ones of the conductors. In the illustrated device, it is assumed that the copper strips 14, 16, 18, 20 and 22 are covered by the insulating cover ply, and the cover ply is accordingly provided with openings all designated 28 to afford access for contact elements to engage the conducting strips.

As a result of the method of manufacture, each of the strips at the edge of the sheet 10 has a connector extension 36 in the form of a round wire. As an example, the conducting strips of a particular printed circuit sheet or board have a thickness of about 0.006" and the wire extensions 30 have a diameter of about 0.030". The wire extensions may be connected to external circuit by conventional connectors without requiring soldered connections.

In order to mass produce the printed circuit sheet 10 in the most economical manner, thin flat sheets 32, die cut to the required shape, are provided with a very thin film of adhesive, preferably one adapted when cured to become in effect a part of the sheet.

Onto this sheet are deposited bent wire elements 34, as seen in FIG. 3, the ends of which desirably extend beyond an edge of the sheet, as seen at 36 in FIG. 1. These wire elements have the same configuration as that required for the flattened strips. The bent and deposited wire elements are retained in the desired pattern by the adhesive.

Thereafter pressure is applied to flatten the wire elements and the pressure further bonds the flattened wire elements or strips to the thin sheet 32. When this step is completed the round wire elements, initially on the surfaces of sheet 32 as seen in FIG. 3, have been flattened into thin flat strips as indicated at 38 in FIG. 4, and firmly bonded to the surface of sheet 32.

To complete the article, the structure shown in FIG. 4, may be laminated onto a thicker sheet of the same or equivalent plastic, and provided with a cover ply of the same or equivalent material. Such a structure is illustrated in FIG. 5, where the plies of plastic material are shown as essentially unitary, leaving the strips 14 and 22 embedded in the sheet 12 and exposed at openings 28 as heretofore described.

Where it may be preferred to leave the strips exposed at one side of the structure, the cover ply is simply omitted, and the structure of FIG. 6 results. This may of course be laminated to a backing sheet if its intended use requires.

Referring now to FIG. 7, there is diagrammatically illustrated a further refinement of the method and apparatus for carrying out the method in a fully automatic manner. In this figure, a continuous roll 40 of the thin flexible plastic material 32 is provided and the material is advanced step-by-step over a table 42. Alternatively, precut plastic sheets having, for example, the outline sheet 12. FIG. 1, may be advanced.

Wire cutting, bending, and depositing devices, generally designated 44, are provided above the advancing sheet material. Details of those devices form no part of the present invention, and hence are not shown. It is sufficient to note that each device 44 cuts a required length of wire, bends it into the configuration of one of the strips 14, 16, 18, 20 or 22, and deposits it on the sheet material in proper juxtaposition to the other lengths of wire. For example, device 44a may cut and bend a length of wire into the configuration of conducting strip 14. While the sheet material is at rest between consecutive feeding steps, the wire is moved down onto the adhesive coated sheet, where it is deposited in a precisely predetermined position.

Following advance of the continuous sheet material 32 a distance equal to the spacing between wire forming devices 44, a wire is cut and bent by device 44b to the configuration of strip 16. Devices 44a and 44b (actually together with devices 44c, 44d and 44e) are then actuated to deposit the cut and bent wire elements and the wire element deposited by device 44b will of course position its wire element in the proper relation to the wire element deposited by device 44a. Devices 44c, 44d and 44e operate in precisely the same way as devices 44a and 44b, so that during normal production, each time the devices 44 are actuated a pattern such as shown in FIG. 1 is completed.

The continuous sheet material 32 may have adhesive applied by an applicator roll, not shown, prior to advance to device 44a, or, if desired, may carry an adhesive material, preferably a pressure sensitive adhesive in the roll. In any case the pattern of wires deposited on the sheet material 32 is preserved.

A press 46 is provided beyond the last device 44e, and a flat plate die is moved downwardly into registration with an area of the sheet material 32 on which a complete pattern of bent wire elements is retained in position. Sufficient pressure is applied to flatten the wire elements into the thin flat flexible conducting strips 14, 16, 18, 20 and 22. At the same time these strips are adhered or permanently bonded to the top surface of the sheet material.

In some cases the wire elements may be pressed slightly into the plastic material, but in general the flat strips remain affixed to the surface of the sheet material.

Where the sheet material has been advance in a continuous strip the final pressing operation may be combined with a die cutting operation which will cut out a portion of the sheet having the desired outline, such, for example, as illustrated in FIG. 1.

Mention has previously been made of advantages following leaving laterally projecting ends of the wire elements unflattened, as indicated at 36. This is accomplished simply by leaving end portions of the wire elements to extend beyond the area of pressure application by the die of the press. Where the sheet material is die cut at the press, an edge of the continuous sheet 32 may constitute a part of the outline of the final cut sheet 12. Where the sheets 12 are precut of course the flat die of press 46 may conform to the shape pf the precut sheet, and any wire portion projecting beyond an edge of the sheet remains unflattened.

In a typical example, the plastic sheet material had a thickness of about 0.005 inch. The thickness is not critical since the function of the sheet material is primarily to support the cut and shaped wire elements in position until pressed flat, and thereafter to similarly support the strips 14, 16, 18, 20 and 22 in the required pattern. If no backing ply is to be provided, the sheet material onto which the cut and shaped wire portions are deposited may be as dictated by intended use.

Excellent results have been achieved using wire having a diameter of 0.030 inch, and flattening the wire to strips having a thickness of 0.004-0.008 inch, in a particular instance to 0.006 inch. In this case the strips had a width somewhat less than 0.120 inch. The reduction in thickness from wire to strip is to about 15-25% of the wire diameter, preferably about 20%.

In the foregoing, the operation as described results in flattening the wire onto the surface of the plastic sheet, with little if any penetration. However, by selecting a plastic sheet which is softer, initial pressure on the wire will press it through the plastic into contact with a hard flat support surface, and as it flattens and becomes wider, it displaces the plastic laterally. In the final stage of compression, the plastic material at the edge of the metal is itself re-flattened.

The product of this operation is seen in FIG. 8, where the metal of the wire is flattened to form the conductor which is embedded in the plastic sheet 52. The shaped flattened wire is retained in the sheet in shaped configuration and the sheet 52 is adhered to a backing sheet indicated in dotted lines at 54, and may, if desired, be supplied with a cover sheet 56 which may be apertured to expose conductor 50, one such aperture being seen at 58.

Equivalent results may be obtained by selecting a plastic capable of being heat softened, and heating it mildly before or during the wire-flattening operation.

It may be mentioned that in production, the plastic sheet onto or into which the wire is flattened may be supplied in a continuous roll. After the several wires have been placed and flattened therewith, separate die cut pieces of plastic sheet, each having openings to expose selected areas of conductor, may be deposited on the continuous sheet and adhered thereto by pressure. The finished structures are finally die cut from the laminated plastic and metal into the required outline.

I claim

1. The method of making the equivalent of a printed circuit comprising a sheet of insulating material having thereon a plurality of separated insulating strips adapted to be connected into electrical circuitry, which comprises shaping a plurality of circular cross-section conducting wire to the shape of the desired conducting strips, fixing the shaped wires in the desired pattern on a thin sheet of insulating material, and finally pressing the assembly of wires and sheet between flat opposed die surfaces to reduce the wires to thin flat flexible strips.

2. The method as defined in claim 1 in which said wires have an initial diameter of 0.020-0.040 inch and when flattened have a thickness of 0.004-0.008 inch.

3. The method as defined in claim 1 in which said wires have an initial diameter of about 0.030 inch, and when flattened have a thickness of about 0.006 inch.

4. The method as defined in claim 1, which comprises reducing the wire to a thickness of 15-25% of the diameter of the wire.

5. The method as defined in claim 1, in which at least some of the wires extend beyond the area of pressure application to the side of the assembly having the wires, so that such wires include flattened thin conducting portions adhered to the insulating sheet, and round connector portions forming an integral part thereof and extending beyond an edge of said sheet.

6. The method as defined in claim 1, comprising the additional step of applying at least one cover sheet over the plastic sheet into which the wires are pressed as they are flattened.

7. The method as defined in claim 6, in which at least one cover sheet is provided with openings at predetermined locations for exposing the flattened conductor strips for electrical connections thereto.

8. The method as defined in claim 1, which comprises providing an adhesive on the surface of the insulating sheet to retain the wire elements in assembled shape and pattern.

9. The method as defined in claim 1, in which the insulating sheet is a polyethylene resin.

10. The method as defined in claim 9, in which the sheet is transparent.

11. The method as defined in claim 9, in which the wire is copper.

12. The method as defined in claim 10, in which the wire is copper.

13. The method as defined in claim 1, in which the wires are reduced to strips essentially on the surface of the sheet.

14. The method as defined in claim 1, in which the wires are pressed through the sheet and displace the plastic material of the sheet laterally as they are widened into strips.

* * * * *